United States Patent
Jen et al.

(10) Patent No.: US 7,807,986 B1
(45) Date of Patent: Oct. 5, 2010

(54) ION IMPLANTER AND METHOD FOR ADJUSTING ION BEAM

(75) Inventors: Ko-Chuan Jen, San Jose, CA (US); York Yang, Taichung (TW); Zhimin Wan, Sunnyvale, CA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 0 days.

(21) Appl. No.: 12/473,167

(22) Filed: May 27, 2009

(51) Int. Cl.
  *H01J 37/317* (2006.01)
  *H01J 49/20* (2006.01)
(52) U.S. Cl. ............ 250/492.21; 250/396 R; 250/396 ML; 250/492.3; 313/361.1; 315/111.41
(58) Field of Classification Search ........... 250/492.21, 250/396 R, 396 ML, 492.3; 313/361.1; 315/111.41
See application file for complete search history.

(56) References Cited

U.S. PATENT DOCUMENTS 5,032,202 A * 7/1991 Tsai et al. ............ 156/345.42
5,691,537 A * 11/1997 Chen et al. ............ 250/251

* cited by examiner

*Primary Examiner*—Nikita Wells
(74) *Attorney, Agent, or Firm*—Stout, Uxa, Buyan & Mullins LLP

(57) ABSTRACT

An ion implanter and method for adjusting the shape of an ion beam are disclosed. After an ion beam is outputted from an analyzer magnet unit, at least one set of bar magnets is used to adjust the shape of the ion beam when the ion beam passes through a space enclosed by the bar magnets. The set of bar magnets can apply a multi-stage magnetic field on the ion beam. Hence, different portions of the ion beam will have different deformations or alterations, because the multi-stage magnetic field will apply a non-uniform force to change the trajectory of ions. Moreover, each bar magnet of the set is powered by one and only one power source, such that the set of bar magnets essentially only can adjust the magnitude of the multi-stage magnetic field. Particular structures and techniques for achieving the multi-stage magnetic field are not limited.

25 Claims, 10 Drawing Sheets

ION IMPLANTER AND METHOD FOR ADJUSTING ION BEAM

BACKGROUND OF THE INVENTION

1. Field of the Invention

The present invention generally relates to ion implantation, and more particularly, to an ion implanter and a method for adjusting a shape of an ion beam with a simple mechanism and relatively low cost.

2. Description of the Prior Art

Ion implantation processes are widely used in semiconductor manufacture, for example, to implant wafers with various ions having desired energy. Ion implantation processes typically require a uniform and consistent amount of ions to be implanted into a semiconductor wafer.

A conventional ion implanter includes at least an ion source and an analyzer magnet unit (AMU). The ion source is used to generate an ion beam. The ion beam generated from the ion source is analyzed by the AMU before the required ions are implanted into a wafer. Although the ion beam is analyzed by the AMU, the shape (cross-sectional shape) of the ion beam usually is not perfect as required. For different applications, the shape required for the ion beam usually varies. Different implantation parameters usually correspond to different required shapes; for example, a spot-shape and a line-shape are used for different implantation parameters.

Some prior art devices achieve these different beam-shape requirements by amending the designs of the ion source and/or the AMU, such that ion beams outputted from the AMU can almost, even perfectly, have the required shapes. However, implementation of the technology is difficult, and usually requires a complex mechanism and a high cost.

On the other hand, some prior art devices achieve the beam-shape requirement by applying a magnetic field, or an electromagnetic field, to change the motion trajectories of ions, such that the shape of the ion beam 10 is changed. Here, after an ion beam is outputted from the AMU, the magnetic field is applied to further adjust the shape of the ion beam. As shown in FIG. 1A, a conventional ion implanter typically includes an ion source 110, an AMU 120, a first bar magnet 131, and a second bar magnet 132. The ion beam 10 is generated by the ion source 110 and adjusted by the AMU 120 before it is injected into a wafer 20. Herein, the first bar magnet 131 and the second bar magnet 132 are separately located on opposing sides of the trajectory of the ion beam 10 and used to adjust the shape of the ion beam 10.

FIG. 1B shows an example of the first bar magnet 131 and the second bar magnet 132 being located on opposite sides of the pre-determined trajectory of the ion beam 10. Moreover, the first bar magnet 131 includes a first support rod 141 and a first winding coil 151, and the second bar magnet 132 includes a second support rod 142 and a second winding coil 152. Hence, when current $I_1$ and/or $I_2$ flows through the first bar magnet 131 and/or the second bar magnet 132 respectively, a magnetic field between the first bar magnet 131 and the second bar magnet 132 is generated which then affects the motion of ions.

FIG. 1C shows how the shape of the ion beam 10 is affected by the magnetic field between the first bar magnet 131 and the second bar magnet 132. As usual, the first winding coil 151 and the second winding coil 152 are uniformly distributed along the first support rod 141 and the second support rod 142, respectively, such that a continuous magnetic filed is formed, whereby the ion beam 10 can then be adjusted. Herein, each of the first/second support rod 141/142 is usually distributed along a direction intersecting with the ion beam travel direction. For example, the rod can be distributed along a direction perpendicular to the ion beam travel direction. Moreover, the continuous magnetic field essentially is a single-stage magnetic field because both the magnitude and the direction of the continuous magnetic field are gradually varied without any back and forth variation. When the currents $I_1$ and $I_2$ are parallel as shown in FIG. 1B, the magnetic fields generated by each bar magnet are generally opposite in direction in the space between the bar magnets. Significantly, the overall magnetic field contributed by both bar magnets points down near bar magnet 131, points up near bar magnet 132, points left toward magnet 131 in space below the center point, and points right toward bar magnet 132 in space above the center point. This is a typical quadrupole field. The quadrupole field can compress the ion beam in one direction and extend it in the other direction, depending on the relative direction between an ion beam and the bar magnets. When an ion beam 10 travels out of the paper in FIG. 1C, and the currents $I_1$ and $I_2$ flow in the direction shown in FIGS. 1B and 1C, the quadrupole field compresses the ion beam in the X direction and extends it in the Y direction, forming a beam narrower in the X direction and taller in the Y direction. When both currents $I_1$ and $I_2$ are reversed, the field extends the beam in the X direction and compresses it in the Y direction, forming a beam wider in the X direction and shorter in the Y direction.

However, for practical implantation requirements, the continuous magnetic field shown in FIG. 1C usually cannot effectively adjust the shape of the ion beam 10. In short, it only can smoothly change the ion beam shape between spot-shape and line-shape, but cannot strongly deform the ion beam shape because the corresponding winding coil and the support rod can change only the magnitude of the continuous magnetic field.

Therefore, as shown in FIG. 1D, yet another prior art approach was devised for adjusting the structure of both the first bar magnet 131 and the second bar magnet 132. In this case, the first bar magnet 131 includes a first support rod 141 and a plurality of winding coils 151/153/155. The winding coils 151/153/155 may be variably distributed along the first support rod 141. The second bar magnet 132 includes a second support rod 142 and a plurality of winding coils 152/154/156. The winding coils 152/154/156 also may be variably distributed along the second support rod 142. Power sources 161-166 are electrically coupled with the winding coils 151-156 respectively. Hence, when the real position/length of each of the winding coils 151-156 is variable and the power sources 161-166 are independently operable, it is possible to induce a multi-stage magnetic field wherein both the magnitude and the direction of the continuous magnetic field can be gradually varied with at least one back and forth oscillation. Therefore, owing to the fact that different portions of the ion beam may be affected by different portions of the multi-stage magnetic field, the shape of different portions of the ion beam 10 can be independently adjusted.

However, for practical implantation requirements, the multi-stage magnetic field shown in FIG. 1D usually is too complex and expensive to be used. In short, to the extent winding coils 151-156 and power sources 161-166 are provided with different configurations and currents such that multi-stage magnetic fields can be induced, the total mechanism and its proper operation may be too complex.

Because of disadvantages associated with the prior art mentioned above, a need exists to propose a novel ion implanter and a novel method for adjusting an ion beam so as to effectively and economically adjust the shape of an ion beam without having to substantially modify the conventional ion implanter.

SUMMARY OF THE INVENTION

Accordingly, discovery has been made of the present invention, which is believed to meet such a need as described above by way of providing a novel ion implanter and method for effectively and economically adjusting the shape of an ion beam without requiring substantial or expensive changes to the conventional ion implanter.

As usual, for many practical ion implantation processes used in semiconductor manufacturing, the required variations in the shape of the ion beam are finite. Particularly, the combination of both the commercial ion source and the commercial analyzer magnet unit (AMU) usually can provide an ion beam with a real shape briefly similar to (e.g., about the same as) the required shape. Moreover, as usual, the ion beam shape is only a spot-shape and/or a line-shape, i.e., the cross-section of the ion beam usually is not polygon- and/or irregular-shaped. Therefore, according to a feature of the present invention, it is possible to achieve the required ion beam shape by adjusting only the magnitude of the magnetic field, which is being applied, in order to change the forces being applied on different portions of the ion beam.

The invention provides a method for adjusting the shape of an ion beam. After the ion beam is outputted from an AMU, at least one set of bar magnets is used to adjust the shape of the ion beam when the ion beam passes through a space enclosed by the bar magnets. Here, the set of bar magnets can apply a magnetic field of multiple stages (multi-stage magnetic field) on the ion beam. Hence, different portions of the ion beam will be differently deformed (e.g., altered) whereby the shape of the ion beam can be adjusted. Each bar magnet of the set is powered by one and only one power source, such that the set of bar magnets essentially can adjust only the magnitude of the multi-stage magnetic field. As disclosed herein, particulars on how the non-uniform magnetic field is provided are not intended to be limited.

The present invention also provides an ion implanter for adjusting an ion beam. The ion implanter includes an ion source, an AMU, and a first set of bar magnets. The ion source is capable of generating an ion beam, the AMU is capable of analyzing the ion beam, and the first set of bar magnets is capable of changing a shape of the ion beam after the ion beam is adjusted. The first set of bar magnets includes a first bar magnet and a second bar magnet, whereby at least one bar magnet set is capable of applying a multi-stage magnetic field on the analyzed ion beam when the analyzed ion beam passes through a space between the first bar magnet and the second bar magnet.

The present invention further provides another method for adjusting an ion beam. This method first prepares an ion implanter as mentioned above, and then adjusts at least one factor of a multi-stage magnetic field. Hence, at least the magnitude of the multi-stage magnetic field is adjusted to deform (e.g., alter) the shape of the ion beam.

DETAILED DESCRIPTION OF THE INVENTION

A detailed description of the present invention will be provided by way of the following embodiments, which are not intended to limit the scope of the present invention and which can be adapted for other applications. While the drawings are illustrated in detail, it is appreciated that the quantity of the disclosed components may be greater or less than that disclosed, except for instances expressly restricting the amount of the components.

Figure 2A:
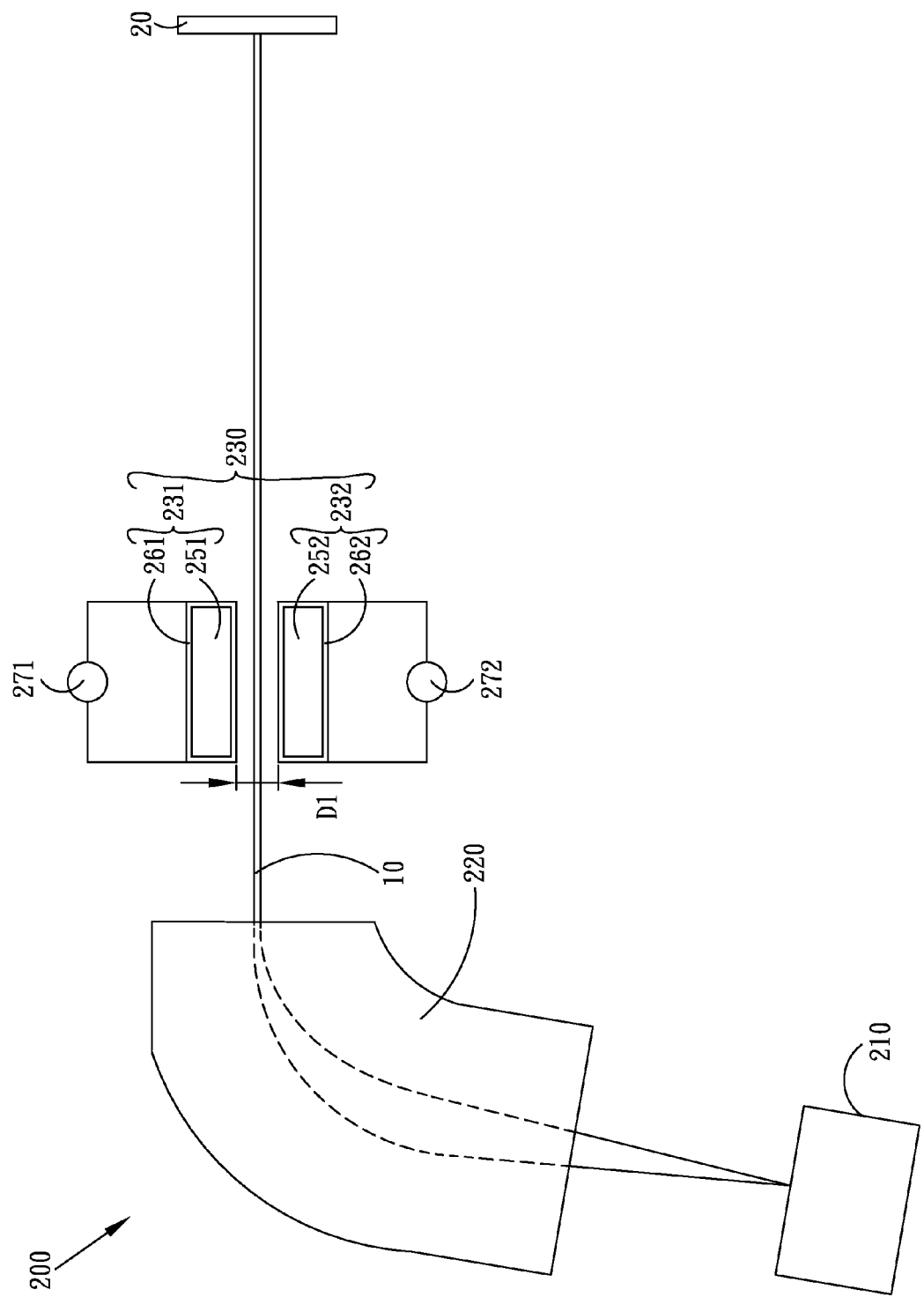
FIG. 2A shows a diagram of an ion implanter for adjusting an ion beam in accordance with an embodiment of the present invention.

FIG. 2A shows a diagram of an ion implanter 200 for adjusting an ion beam 10 in accordance with an embodiment of the present invention. The ion implanter 200 includes an ion source 210, an analyzer magnet unit (AMU) 220, and a first set of bar magnets 230. Here, the ion source 210 is capable of generating an ion beam 10, the AMU 220 is capable of analyzing the ion beam 10, and the first set of bar magnets 230 is capable of adjusting a shape of the ion beam 10 after the ion beam 10 is adjusted by the AMU 220.

The first set of bar magnets 230 includes a first bar magnet 231 and a second bar magnet 232. The first bar magnet 231 includes a first support rod 251 and a first continuous loop of winding coils 261 which is distributed along the first support rod 251, and the second bar magnet 232 is located in a first preset distance $D_1$ from the first bar magnet 231. The second bar magnet 232 likewise includes a second support rod 252 and a second continuous loop of winding coils 262 which is distributed along the second support rod 252. Moreover, the ion implanter 200 also includes a first power source 271 and a second power source 272 which are electrically coupled with the first bar magnet 231 and the second bar magnet 232 respectively. Here, the operation of the first power source 271 can be independent or dependent on the operation of the second power source 272. Particularly, at least one bar magnet 231/232 is capable of applying a magnetic field of multiple stages (multi-stage magnetic field) on the analyzed ion beam 10 when the analyzed ion beam 10 passes through a space between the first bar magnet 231 and the second bar magnet 232.

One basic concept of the invention is using one and only one power source, such as 271 and 272, to provide the current required by one bar magnet, such that only the magnitude of a multi-stage magnetic field induced by the bar magnet is changed. Also, another basic concept of the invention is using at least one non-uniform factor, such as different materials or different shapes, to induce the required multi-stage magnetic field for deforming (e.g., altering) a different portion of the ion beam. Furthermore, particulars on how to provide the power source, how to adjust the non-uniform factor(s) for adjusting the multi-stage magnetic field and the practical geometric configuration of the two bar magnets 231/232 are not intended to be limited in the invention.

Figure 1A:
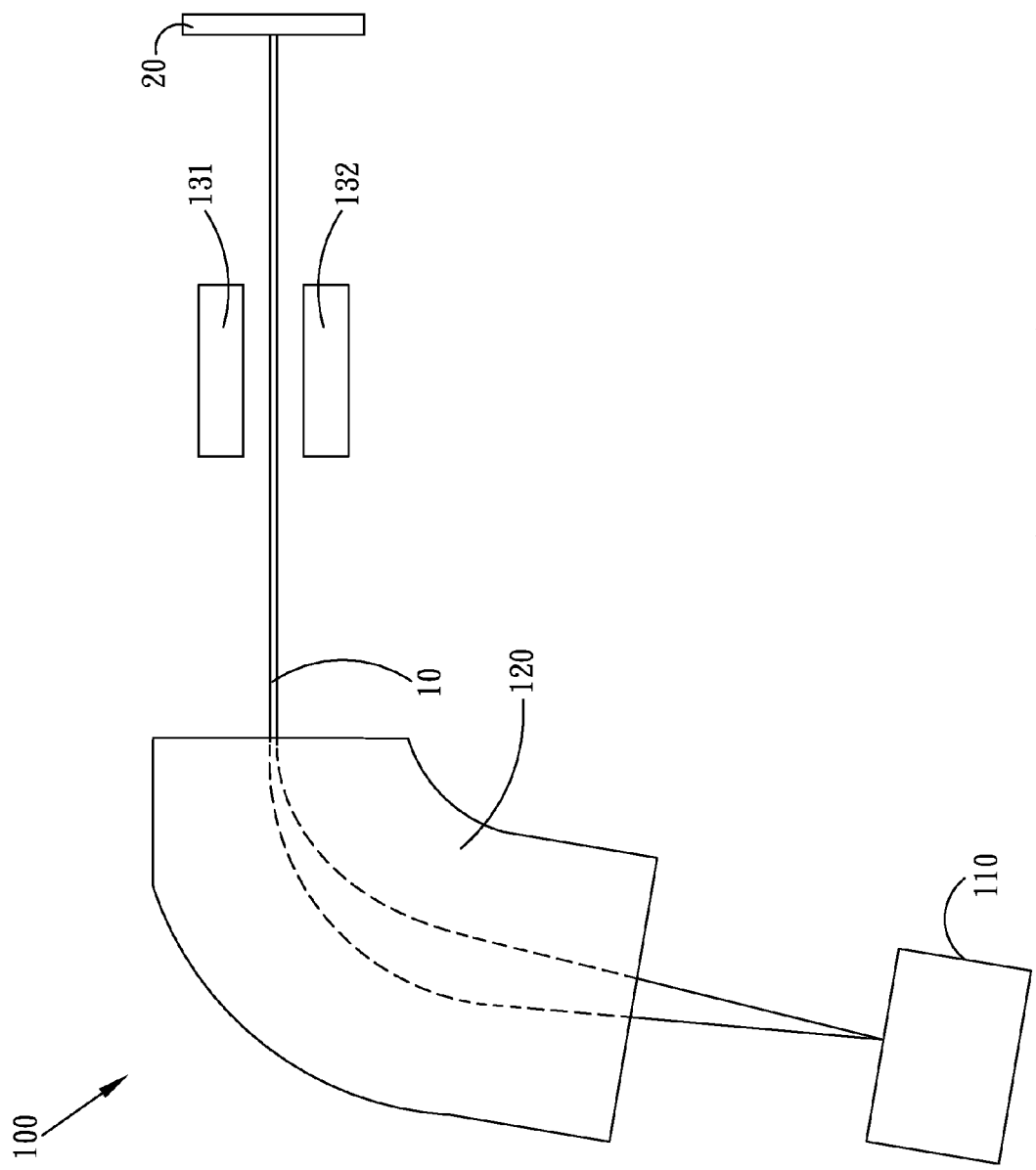
FIG. 1A is a simplified diagram of a conventional ion implanter.
Figure 1B:
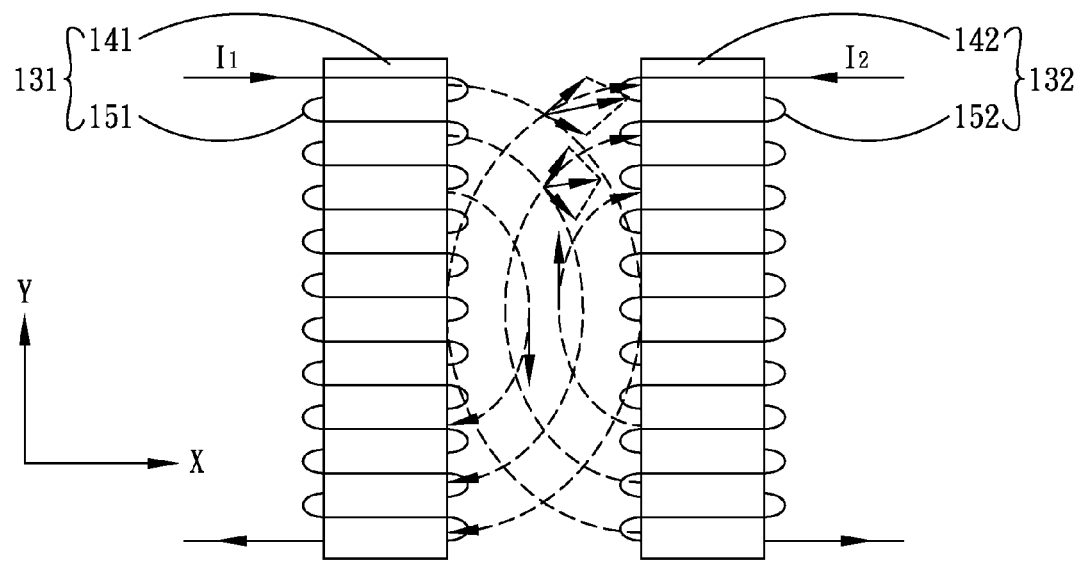
FIG. 1B shows a magnetic field generated by a first bar magnet and a second bar magnet respectively.
Figure 1C:
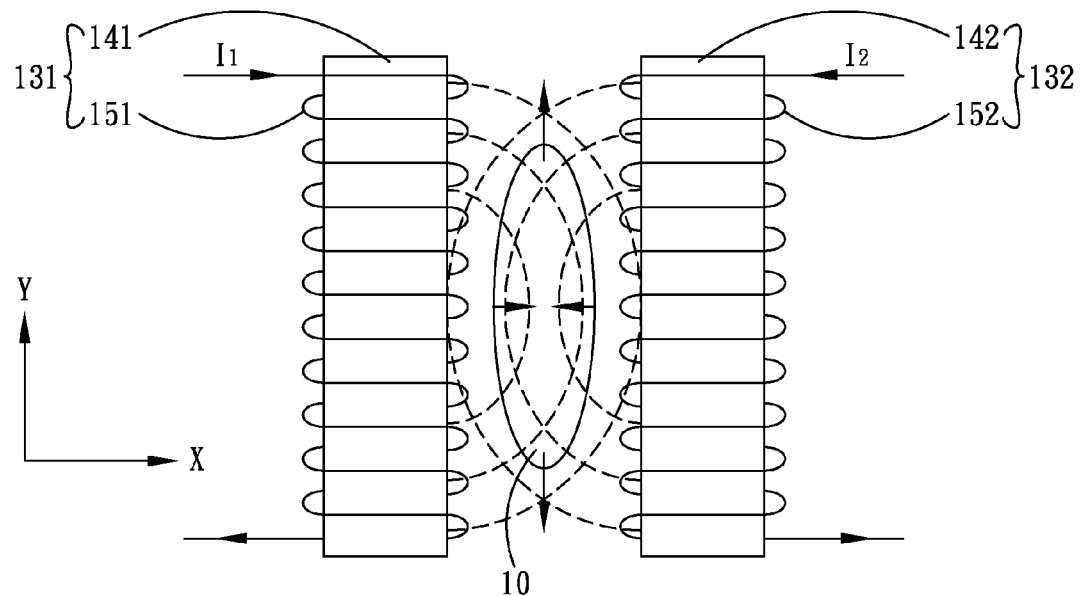
FIG. 1C shows how the shape of an ion beam is controlled by the magnetic field between the first bar magnet and the second bar magnet according to one prior-art construction.
Figure 1D:
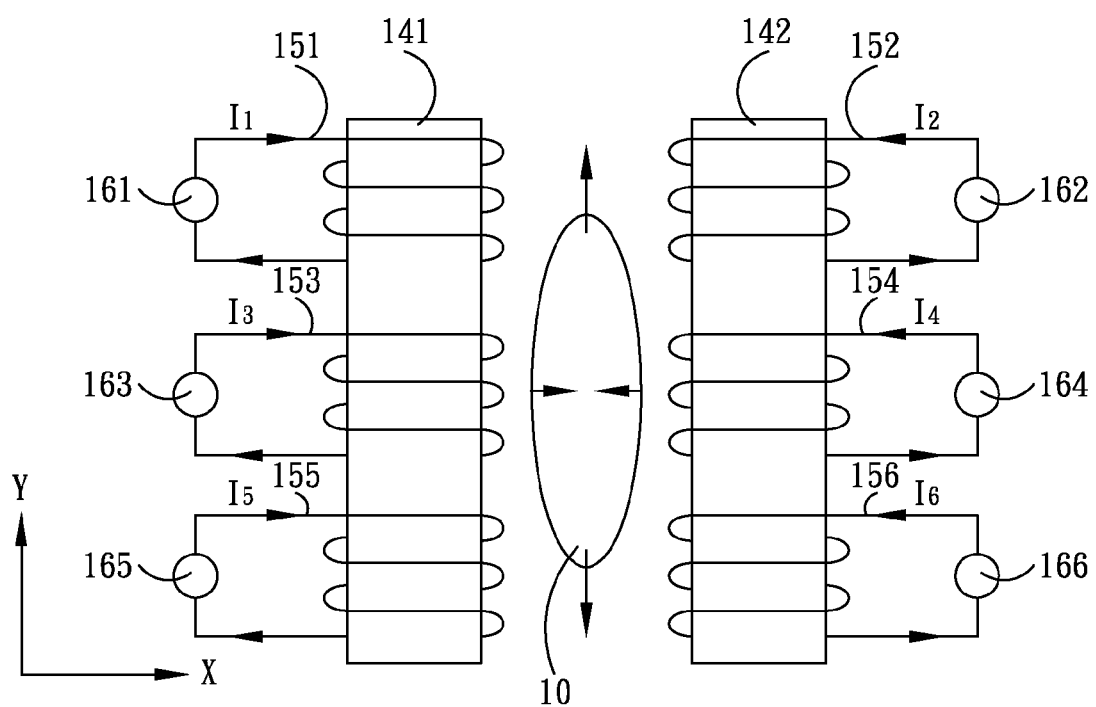
FIG. 1D shows how the shape of the ion beam is controlled by the magnetic field between the first bar magnet and the second bar magnet according to another prior-art construction.

Accordingly, by comparing FIG. 2A with both FIG. 1C and FIG. 1D, the advantages of the invention are apparent and significant. First, the produced magnetic field is multi-stage rather than a single-stage magnetic field as shown in FIG. 1C, such that the disadvantages of the prior art shown in FIG. 1C can be effectively improved. Next, there is one and only one power source for providing the current required by one bar magnet; hence, the complexity of the prior art structure shown in FIG. 1D is effectively avoided. Here, it should be noted that the direction of the first set of bar magnets 230 is not particularly limited. It can be changed to adjust the projection of the ion beam on the wafer 20 to be implanted.

Figure 2B:
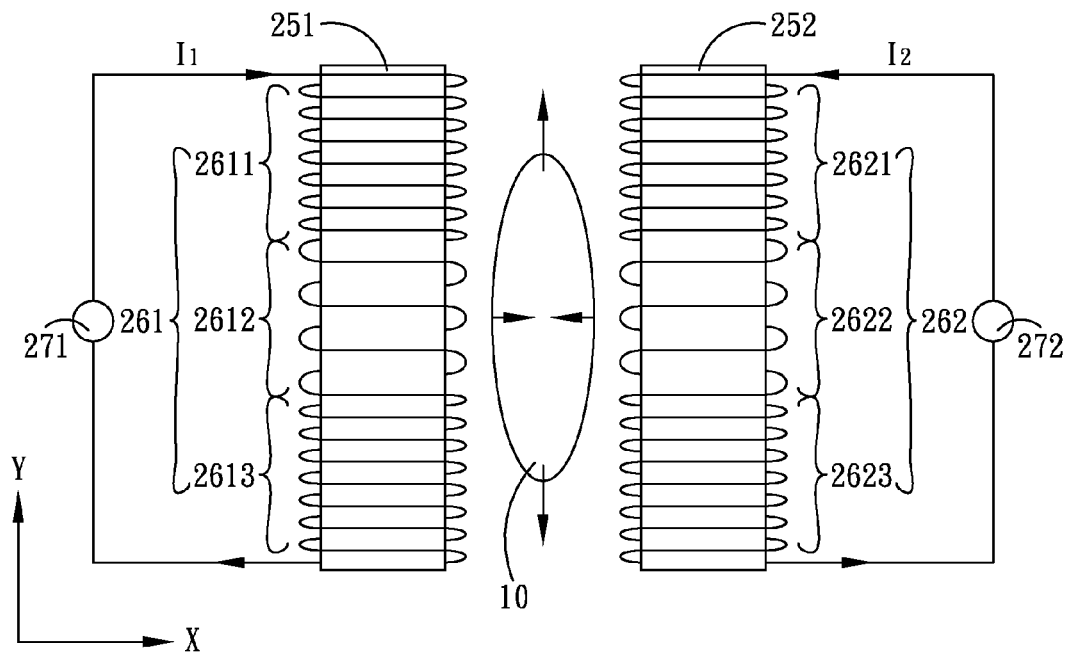
FIG. 2B shows a first embodiment of the first set of bar magnets shown in FIG. 2A.

FIG. 2B shows a first embodiment of the first set of bar magnets 230 shown in FIG. 2A. The first continuous loop of winding coils 261 includes a plurality of sections 2611-2613, wherein at least two different ones of the sections 2611-2613 have a different density of coils or coil density (turns/mm). That is, the coil density is the number of coils per unit length. Besides, the second continuous loop of winding coils 262 also includes a plurality of sections 2621-2623, wherein at least two different ones of the sections 2621-2623 have different coil density (turns/mm). Herein, the first continuous loop of winding coils 261 and the second continuous loop of winding coils 262 are non-uniformly distributed along the first support rod 251 and the second support rod 252 respectively.

In this embodiment, the distribution of the first continuous loop of winding coils 261 along the first support rod 251 is essentially similar to (e.g., about the same as) the distribution of the second continuous loop of winding coils 262 along the second support rod 252. Such design can simplify the calculation and the control of the non-uniform magnetic field. However, the invention allows for different continuous loops of winding coils having different distributions. Moreover, although FIG. 2B shows two non-uniform continuous loops of similar winding coils 261/262, the invention allows for one set of continuous loops of winding coils 261 and 262 to be non-uniform but different, and also allows for only one (e.g., one of the) set of continuous loops of winding coils 261/262 to be non-uniform.

The direction of current $I_1$ flow through the first bar magnet 231 is essentially parallel to the direction of current $I_2$ flow through the second bar magnet 232, such that the ion beam 10 is compressed in a first direction X and extended in a second direction Y which is essentially vertical to the first direction X. Moreover, by at least changing the magnitudes and alternating the directions of both currents $I_1$ and $I_2$, the distribution of the multi-stage magnetic field appearing is changeable, such that the shape of the ion beam 10 can be reasonably adjusted.

Figure 2C:
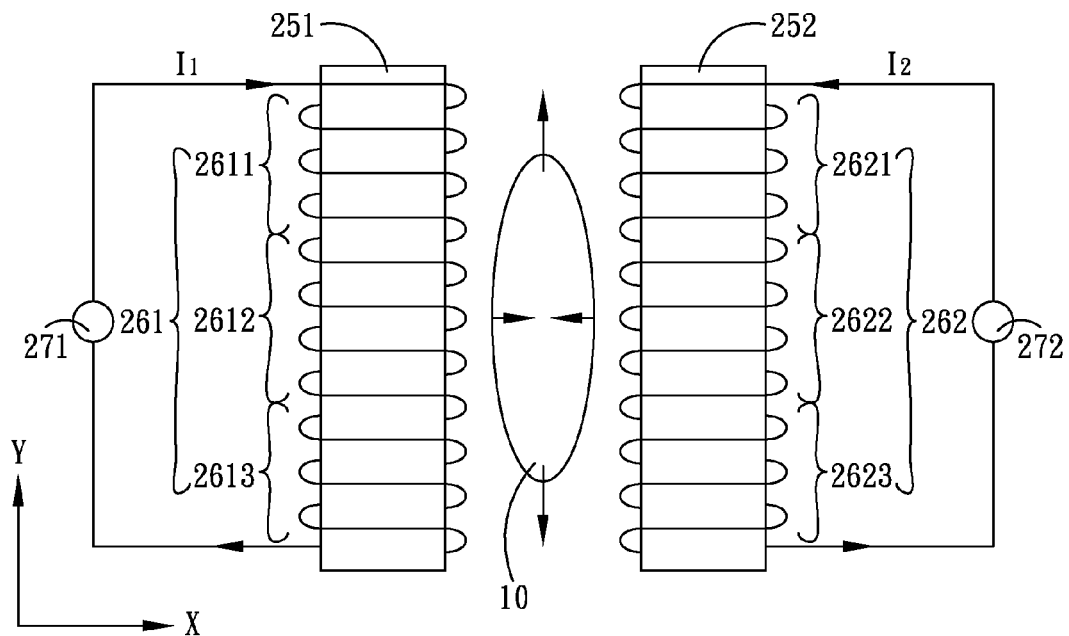
FIG. 2C shows a second embodiment of the first set of bar magnets shown in FIG. 2A.

FIG. 2C shows a second embodiment of the first set of bar magnets 230 shown in FIG. 2A. The first continuous loop of winding coils 261 includes a plurality of sections 2611-2613, wherein at least two different ones of the sections 2611-2613 have different inductor coefficients, such as can be achieved from fabrication thereof from different materials. Moreover, the second continuous loop of winding coils 262 can also include a plurality of sections 2621-2623, wherein at least two different ones of the sections 2621-2623 have different inductor coefficients, such as by construction from different materials.

Again, the first set of bar magnets 230 can have only one continuous loop of winding coils being made of a different material with the other continuous loops of winding coils being made of the same material. Herein, different inductor coefficients will change power through the coils thereby slightly changing the diameters (e.g., via expansion) of the coils, such that a non-uniform magnetic field will be induced. Significantly, other differences of different materials also can be factors of inducing different (non-uniform) magnetic fields. For example, different thermal expansion coefficients can be implemented to change the diameter of each coil, such that the length of each winding coil is changed whereby the induced magnetic field also is correspondingly altered.

Figure 2D:
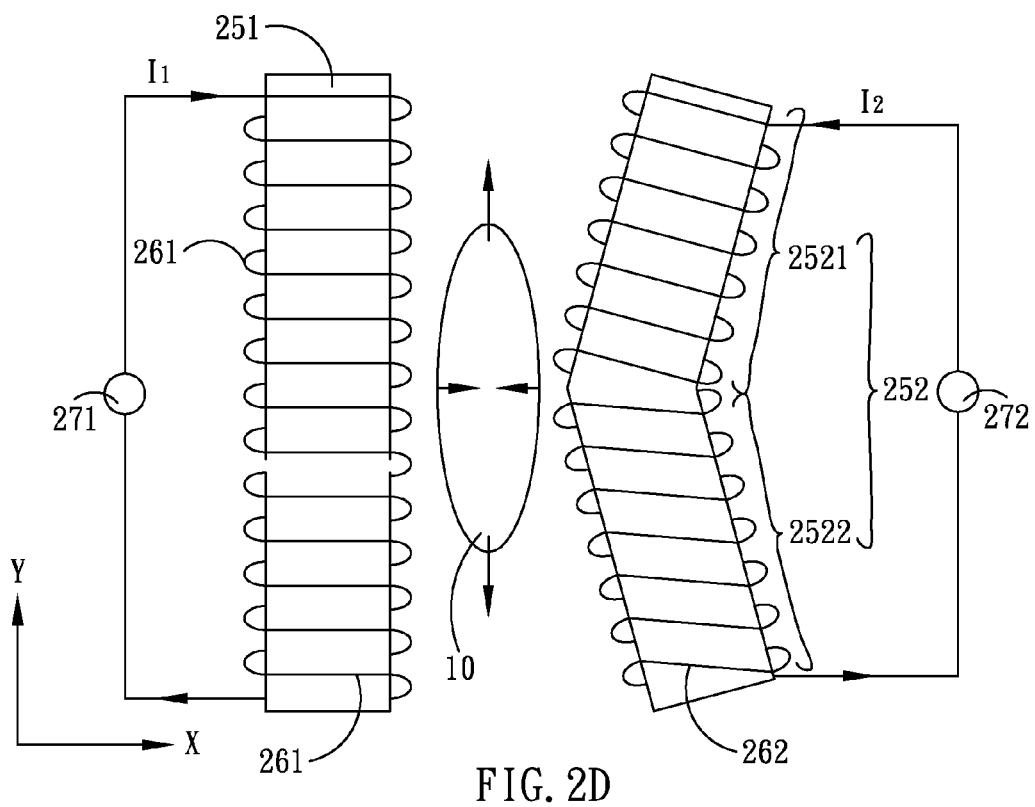
FIG. 2D shows a third embodiment of the first set of bar magnets shown in FIG. 2A.

FIG. 2D shows a third embodiment of the first set of bar magnets 230 shown in FIG. 2A. The second support rod 252 is not straight and includes a plurality of sections 2521-2522, wherein at least two different ones of the sections 2521-2522 have different directions. Of course, the first support rod 251 also can be non-straight.

Clearly, when the distance between two support rods 251/252, or the distance between two continuous loops of winding coils 261/262, is varied along the direction of any support rod 251/252, the magnetic field distributed between the two support rods 252/252 will have multi-stages whereby the shape of the ion beam 10 will then be correspondingly adjusted.

Figure 2E:
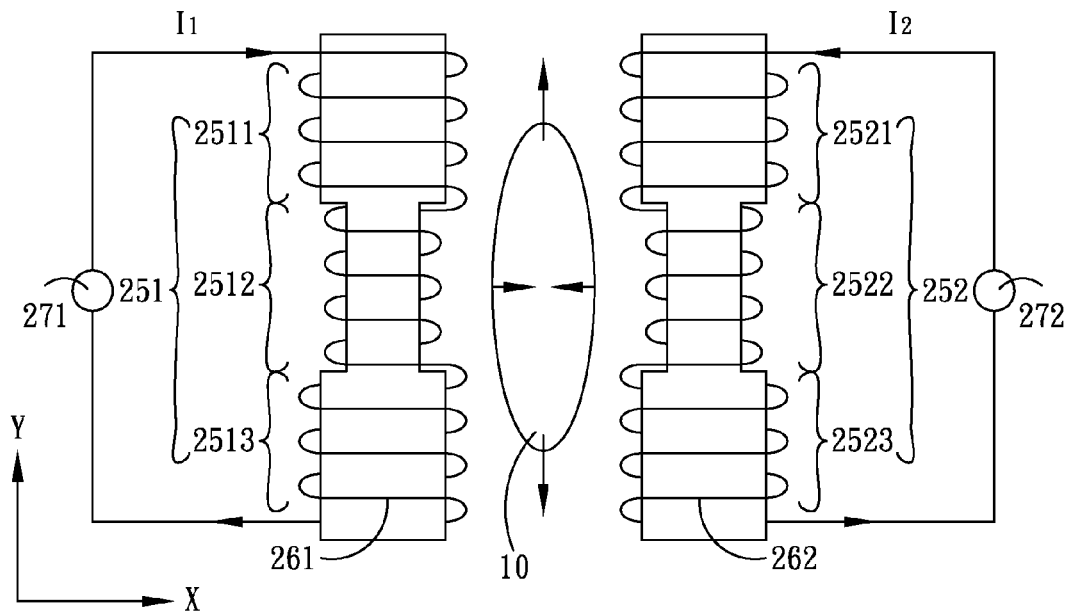
FIG. 2E shows a fourth embodiment of the first set of bar magnets shown in FIG. 2A.

FIG. 2E shows a fourth embodiment of the first set of bar magnets 230 shown in FIG. 2A. The first support rod 251 includes a plurality of sections 2511-2513, wherein at least two different ones of the sections 2521-2522 have different width. At least two different sections of the second continuous loop of winding coils 261 can also have different width. Moreover, the second support rod 252 also includes a plurality of sections 2521-2523, wherein at least two different ones of the sections 2521-2522 have different width, and at least two different sections of the first continuous loop of winding coils 261 can also have different width.

Clearly, if any support rod is made of an electromagnetic conductor, different widths of different sections of any support rod will change the distribution of an induced magnetic field. Moreover, if a continuous loop of winding coils is attached on a support rod, different widths of different sections of a support rod will change the distribution of the continuous loop of winding coils. Hence, the distribution of magnetic field along the direction of each support rod 251/252 will be multi-stage, whereby the shape of the ion beam 10 can then be adjusted when at least the magnitude of the magnetic field can be adjusted by changing the widths of at least two sections of the support rod.

Figure 2F:
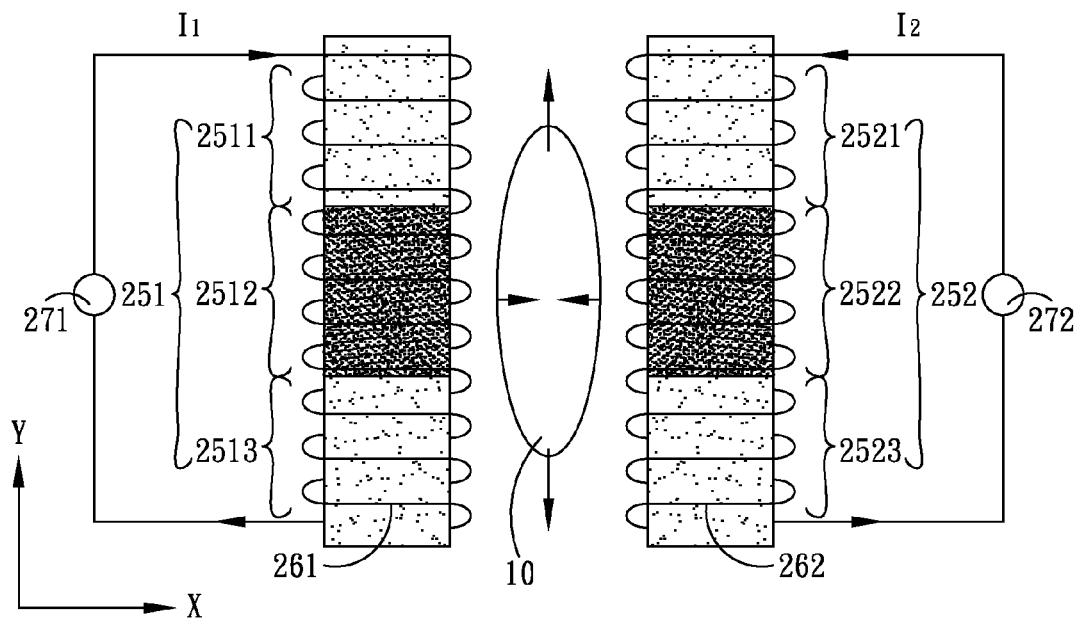
FIG. 2F shows a fifth embodiment of the first set of bar magnets shown in FIG. 2A.

FIG. 2F shows a fifth embodiment of the first set of bar magnets 230 shown in FIG. 2A. The first support rod 251 includes a plurality of sections 2511-2513, wherein at least two different ones of the sections 2511-2512 are made of different material. Besides, the second support rod 252 also includes a plurality of sections 2521-2523, wherein at least two different ones of the sections 2521-2522 are made of different material.

Clearly, the embodiment is similar to the embodiment shown in FIG. 2C; the only difference is which portions are made of different materials. However, regardless of whether/how the support rod(s) 251/252 are made of different materials and/or the winding coils 261/262 are made of different materials, the corresponding magnetic field may be multi-stage between the two support rods 251/252 (or two bar magnets 231/232.)

Figure 2G:
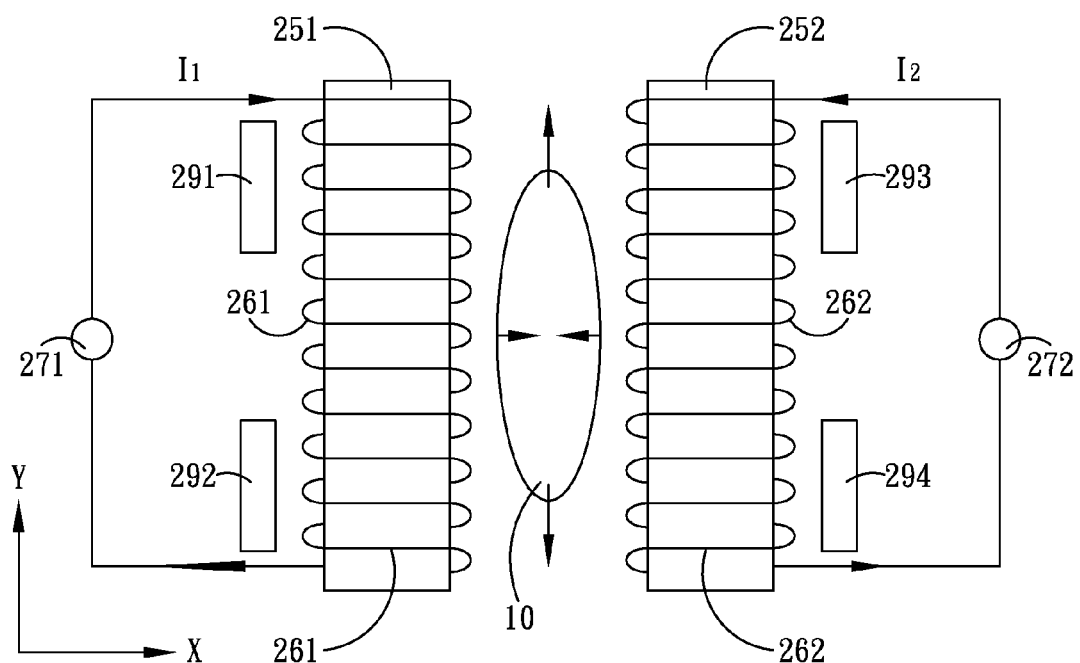
FIG. 2G shows a sixth embodiment of the first set of bar magnets shown in FIG. 2A.

FIG. 2G shows a sixth embodiment of the first set of bar magnets 230 shown in FIG. 2A. At least one section of the first support rod 251 is located close to a conductive structure 291-292 and at least one section of the first support rod 251 is not located close to any conductive structure 291-292. Besides, at least one section of the second support rod 252 is also located close to a conductive structure 293-294, and at least one section of the second support rod 252 is not located close to any conductive structure 293-294.

Figure 2H:
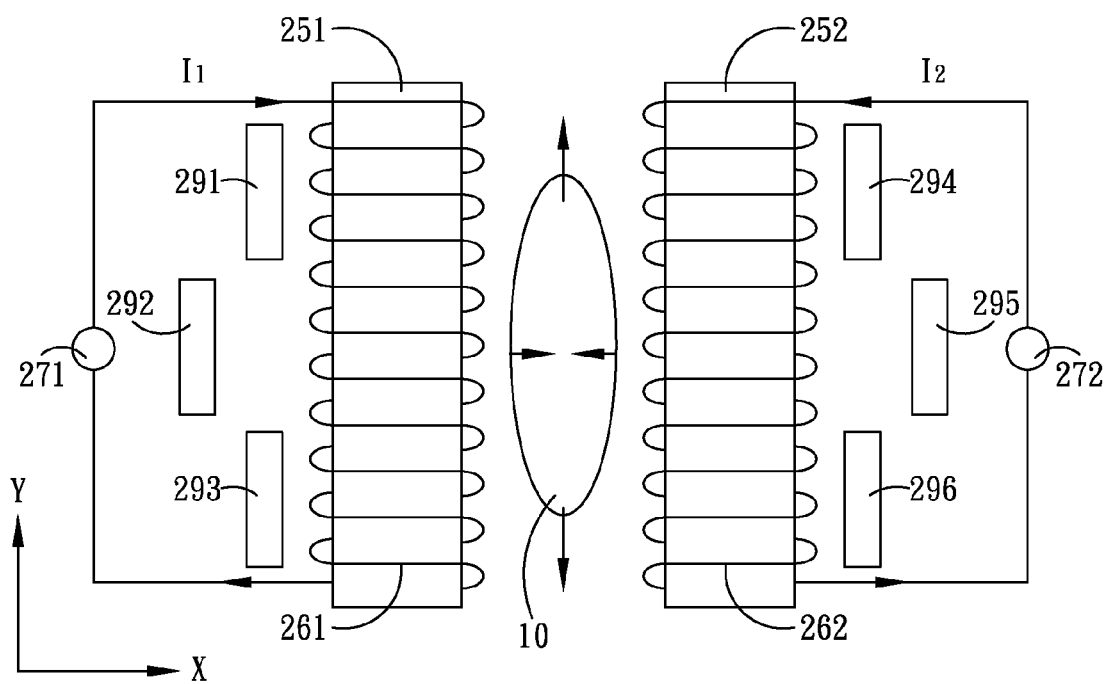
FIG. 2H shows a seventh embodiment of the first set of bar magnets shown in FIG. 2A.

FIG. 2H shows a seventh embodiment of the first set of bar magnets 230 shown in FIG. 2A. Different sections of the first support rod 251 are located close to different conductive structures 291-293, wherein each section and a corresponding one of the conductive structures 291-293 has an individual relative position. Different sections of the second support rod 252 are also located close to different conductive structures 294-296, wherein each section and a corresponding one of the conductive structures 294-296 has an individual relative position.

Clearly, in the two previous embodiments, the existence of the conductive structure(s) will change the distribution of magnetic fields, even when the conductive structure(s) is not located directly between the two support rods 251/252 (or the bar magnets 231/232). Again, the shape of the ion beam 10 can be adjusted by the change on the distribution of magnetic field.

According to the above embodiments, the multi-stage magnetic field of the first set of bar magnets 230 can be induced by many non-uniform factors. For example, the shape of the magnetic field of the first set of bar magnets 230 can be adjusted by changing one or more of the following factors: the number of coils per unit length of the coils 261/262, the materials used to form the coils 261/262, the materials used to form the support rod 251/252 to which the coils 261/262 are attached, the shape of the support rod 251/252, and the shape of the coils 261/262. The shape of the magnetic field of the first set of bar magnets 230 can also be adjusted by changing the first preset distance $D_1$ which is between the first bar magnet 231 and the second bar magnet 232 (such change is not shown in the figure).

Figure 2I:
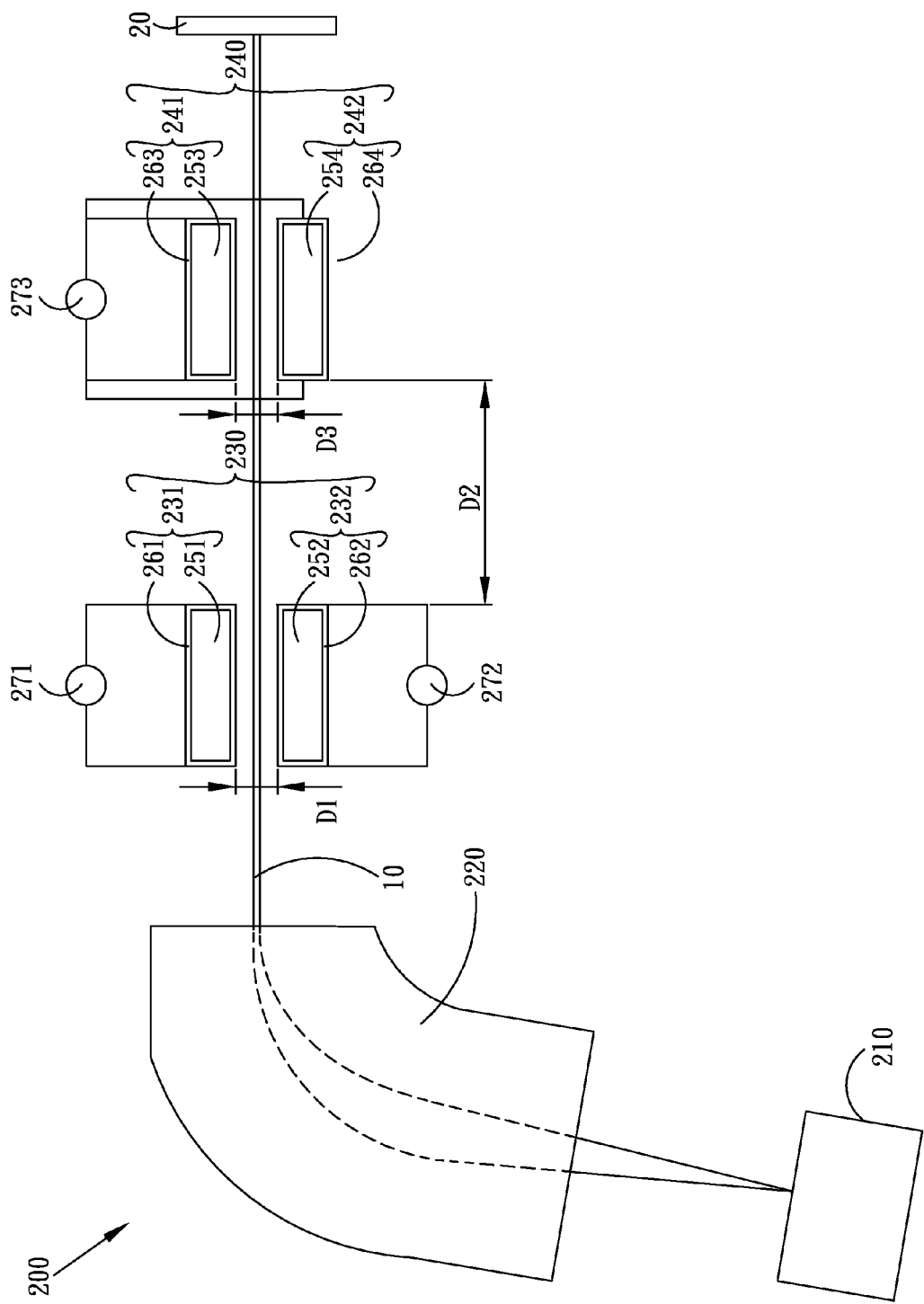
FIG. 2I shows a diagram of an ion implanter for adjusting an ion beam in accordance with another embodiment of the present invention.

FIG. 2I shows another embodiment where the ion implanter 200 further includes a second set of bar magnets 240 which is also capable of changing the shape of the ion beam 10 after the ion beam 10 is adjusted by the AMU 220. The second set of bar magnets 240 is located in a second preset distance $D_2$ from the first set of bar magnets 230. The second set of bar magnets 240 includes a third bar magnet 241 and a fourth bar magnet 242. The third bar magnet 241 includes a third support rod 253 and a third continuous loop of winding coils 263 which is distributed along the third support rod 253. The fourth bar magnet 242 is located in a third preset distance $D_3$ from the third bar magnet 241. The fourth bar magnet 242 includes a fourth support rod 254 and a fourth continuous loop of winding coils 264 which is distributed along the fourth support rod 254. The ion implanter 200 can also include a third power source 273 which is electrically coupled with both the third continuous loop of winding coils 263 and the fourth continuous loop of winding coils 264. The distribution of the third continuous loop of winding coils 263 along the third support rod 253 can be essentially similar to (e.g., about the same as) the distribution of the fourth continuous loop of winding coils 264 along the fourth support rod 254. The third continuous loop of winding coils 263 is essentially parallel to the fourth continuous loop of winding coils 264, such that the ion beam 10 is compressed (or extended) in a first direction X and extended (or compressed) in a second direction Y which is essentially vertical to the first direction X.

Clearly, when the third and/or fourth bar magnets 241/242 has one or more of the factors mentioned above, the second set of bar magnets 240 is essentially similar to (e.g., about the same as) the first set of bar magnets 230. In other words, two proposed sets of bar magnets are used to adjust the shape of the ion beam in sequence.

In contrast, when the third and fourth continuous loops of winding coils 263/264 are uniformly distributed, the second set of bar magnets 240 is essentially similar to (e.g., about the same as) the prior art shown in FIG. 1C. In other words, the proposed set of bar magnets is combined with the prior art shown in FIG. 1C to adjust the shape of the ion beam in sequence.

Clearly, if the power source 273 is replaced by several power sources to respectively supply current to different portions of the third and fourth continuous loops of winding coils 263/264, the second set of bar magnets 240 is essentially similar to (e.g., about the same as) the prior art shown in FIG. 1D. In other words, the proposed set of bar magnets is combined with the prior art shown in FIG. 1D to adjust the shape of the ion beam in sequence.

Accordingly, any type of bar magnets can be positioned between the AMU 220 and the first set of bar magnets 230, or between the first set of bar magnets 230 and the wafer 20 to further deform (e.g., alter) the shape of the ion beam. Herein, owing to each bar magnet being able to adjust the shape of the ion beam 10 independently, the locations of these bar magnets along a predetermined trajectory of the ion beam 10 are flexible.

Of course, when more than one bar magnet is used, each bar magnet can have its individual direction. Then, different portions of the ion beam 10 can be respectively adjusted by different bar magnets, such that a complete deformation (e.g., alteration) of the ion beam 10 is achieved by more than one single and simple deformation (e.g., alteration) of the ion beam 10.

Note that the support rod is optional and not necessary. As usual, a support rod is essentially used to fix a corresponding continuous loop of winding coils, and further used to enhance the induced magnetic field when the support rod is made of an electromagnetic conductor, such as a ferromagnetic material. However, if the structure of the continuous loop of winding coils is strong enough, the support rod can be omitted if it is only used as a support.

Accordingly, by using the proposed ion implanter 200, the shape of the ion beam 10 can be effectively adjusted. Moreover, when only the preexisting (e.g., used) power source(s) and the preexisting (e.g., used) bar magnets are modified to provide a multi-stage magnetic field, the invention can be achieved without strongly amending (e.g., significantly altering) the conventional ion implanter.

Figure 3:
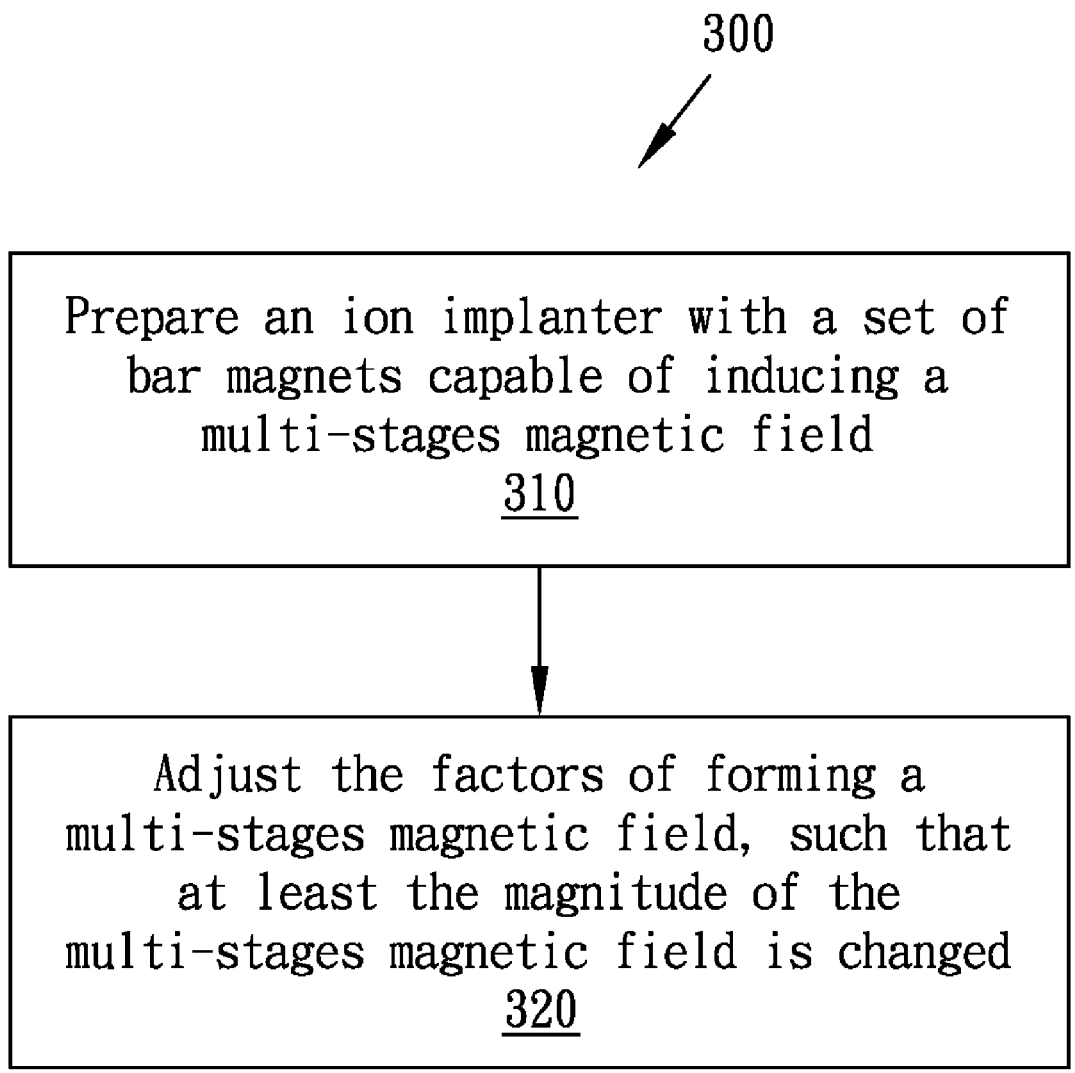
FIG. 3 shows a flow diagram of a method for adjusting an ion beam in accordance with an embodiment of the present invention.

FIG. 3 shows a flow diagram of a method 300 for adjusting an ion beam in accordance with an embodiment of the present invention. The method 300 includes two essential steps 310 and 320. First, as shown in block 310, prepare an ion implanter with a set of bar magnets capable of inducing a multi-stage magnetic field as mentioned above. Then, as shown in block 320, adjust the factors of forming a multi-stage magnetic field as mentioned above, such that at least the magnitude of the multi-stage magnetic field is changed whereby the ion beam is then deformed (e.g., altered) accordingly.

Herein, owing to the details of the ion implanter 200 being equal to those of the embodiments mentioned above, the details and potential variations of the ion implanter 200 are omitted.

Clearly, when the power source is turned off, i.e., there is no current passing through the continuous loop of winding coils, it is easy to change these factors. In other words, the method can be used to manufacture a new ion implanter, and also can be used to adjust an in-use ion implanter when it is maintained.

Of course, if any of these factors can be adjusted when the power source is turned on, i.e., there is a current passing through the continuous loop of winding coils, the method can be used even to adjust an ion implanter during the operation of the ion implanter.

In practice, it may be difficult to change coil shape and rod material during ion implanter operation. However, it is possible to choose any method above to provide a magnetic field to match a specific ion beam shape from an ion source. Hence, the method only needs to adjust the magnetic field magnitude to provide proper ion beam shape.

Although specific embodiments have been illustrated and described, it will be appreciated by those skilled in the art that various modifications may be made without departing from the scope of the present invention, which is intended to be limited solely by the appended claims.

What is claimed is:

1. An ion implanter, comprising:
    an ion source, said ion source being capable of generating an ion beam;
    an analyzer magnet unit, said analyzer magnet unit being capable of analyzing said ion beam; and
    a first set of bar magnets, said first set of bar magnets being capable of controlling a shape of said ion beam after said ion beam is adjusted, and comprising:
        a first bar magnet, said first bar magnet having a first continuous loop of winding coils; and
        a second bar magnet, said second bar magnet being located in a first preset distance from said first bar magnet and having a second continuous loop of winding coils;
    wherein one or more of said bar magnets is capable of applying a multi-stage magnetic field on said analyzed ion beam when said analyzed ion beam passes through a space between said first bar magnet and said second bar magnet.

2. The ion implanter as set forth in claim 1, said first bar magnet further having a first support rod that said first continuous loop of winding coils is distributed along, and said second bar magnet further having a second support rod that said second continuous loop of winding coils is distributed along.

3. The ion implanter as set forth in claim 1, wherein said multi-stage magnetic field is induced by one or more of said bar magnets where a corresponding said continuous loop of winding coils of said bar magnet is non-uniformly distributed along its support rod, which is along a direction intersecting with an ion beam travel direction.

4. The ion implanter as set forth in claim 1, wherein said multi-stage magnetic field can be generated by one or more of following:
    two or more different sections of said continuous loops of winding coils having different coil density;
    two or more different sections of said continuous loops of winding coils having different width;
    two or more different sections of said continuous loops of winding coils having different inductor coefficients;
    two or more different sections of said continuous loops of winding coils made of different materials; and
    two or more different sections of said continuous loops of winding coils having different directions.

5. The ion implanter as set forth in claim 2, wherein said multi-stage magnetic field can be induced by one or more of the following:
    two or more different sections of said support rod having different inductor coefficients;
    two or more different sections of said support rod made of different materials;
    two or more different sections of said support rod having different directions; and
    two or more different sections of said support rod having different width.

6. The ion implanter as set forth in claim 1, wherein said multi-stage magnetic field is generated by one or more of said bar magnets that has one or more of the following characteristics:
    one or more sections of said bar magnet is located close to a conductive structure and one or more sections of said bar magnet is not located close to any conductive structure; and
    different sections of said bar magnet are located close to different conductive structures, wherein one of said sections and a corresponding one of said conductive structures has an individual relative position.

7. The ion implanter as set forth in claim 1, wherein said multi-stage magnetic field is generated by adjusting a relative position between said first bar magnet and said second bar magnet.

8. The ion implanter as set forth in claim 1, wherein a direction of current flow through said first bar magnet is essentially parallel to a direction of current flow through said second bar magnet to form substantially quadrupole field in the space between the two bar magnets.

9. The ion implanter as set forth in claim 1, wherein a distribution of said first continuous loop of winding coils is about the same as a distribution of said second continuous loop of winding coils.

10. The ion implanter as set forth in claim 1, further comprising a first power source electrically coupled with said first continuous loop of winding coils and a second power source electrically coupled with said second continuous loop of winding coils, wherein an operation of said first power source is independent from or dependent on an operation of said second power source.

11. The ion implanter as set forth in claim 1, further comprising a second set of bar magnets capable of controlling a shape of said ion beam after said ion beam is adjusted, said second set of bar magnets being located in a second preset distance from said first set of bar magnets and comprising:
    a third bar magnet, said third bar magnet having a third continuous loop of winding coils; and
    a fourth bar magnet, said fourth bar magnet being located in a third preset distance from said third bar magnet, said fourth bar magnet having a fourth continuous loop of winding coils.

12. The ion implanter as set forth in claim 11, said third bar magnet further having a third support rod that said third continuous loop of winding coils is distributed along, and said fourth bar magnet further having a fourth support rod that said fourth continuous loop of winding coils is distributed along.

13. The ion implanter as set forth in claim 11, wherein said third continuous loop of winding coils is essentially parallel or opposite to said fourth continuous loop of winding coils, such that said ion beam is compressed in a first direction and extended in a second direction being essentially vertical to said first direction.

14. The ion implanter as set forth in claim 12, further comprising a third power source electrically coupled with both said third continuous loop of winding coils and said fourth continuous loop of winding coils.

15. The ion implanter as set forth in claim 11, wherein a distribution of said third continuous loop of winding coils is about the same as a distribution of said fourth continuous loop of winding coils.

16. The ion implanter as set forth in claim 11, further comprising one or more other types of bar magnets positioned between said analyzer magnet and said first set of bar magnets, or between said first set of bar magnets and a wafer to be implanted.

17. A method for adjusting an ion beam in an ion implanter, comprising:
   preparing an ion implanter, said ion implanter comprising:
      an ion source, said ion source being capable of generating an ion beam;
      an analyzer magnet unit, said analyzer magnet unit being capable of analyzing said ion beam; and
      a first set of bar magnets, said first set of bar magnets being capable of controlling a shape of said ion beam after said ion beam is adjusted, comprising:
         a first bar magnet, said first bar magnet having a first continuous loop of winding coils; and
         a second bar magnet, said second bar magnet being located in a first preset distance from said first bar magnet and having a second continuous loop of winding coils;
      wherein one or more of said bar magnets is capable of applying a multi-stage magnetic field on said analyzed ion beam when said analyzed ion beam passes through a space between said first bar magnet and said second bar magnet; and
      adjusting said first set of bar magnets, such that said multi-stage magnetic field can be adjusted accordingly.

18. The method as set forth in claim 17, wherein said first bar magnet further having a first support rod that said first continuous loop of winding coils is distributed along, wherein said second bar magnet further having a second support rod that said second continuous loop of winding coils is distributed along.

19. The method as set forth in claim 18, further comprising adjusting one or more of said bar magnets, such that a corresponding one of said continuous loops of winding coils is non-uniformly distributed along a direction intersecting with ion beam travel direction.

20. The method as set forth in claim 17, further comprising adjusting a non-uniform distribution of a specific said continuous loop of winding coils by one or more of the following:
   adjusting the coil density of said specific continuous loop of winding coils, such that two or more different sections of said specific continuous loop of winding coils have different coil density;
   adjusting the width of said specific continuous loop of winding coils, such that two or more different sections of said specific continuous loop of winding coils have different widths of coils;
   adjusting the material of said specific continuous loop of winding coils, such that two or more different sections of said continuous loop of winding coils have different inductor coefficients;
   adjusting the material of said specific continuous loop of winding coils, such that two or more different sections of said continuous loop of winding coils are made of different materials; and
   adjusting the structure of said specific continuous loop of winding coils, such that two or more different sections of said continuous loop of winding coils have different directions.

21. The method as set forth in claim 18, further comprising adjusting a non-uniform distribution of a specific said support rod by one or more of the following:
   adjusting the material of said specific support rod, such that two or more different sections of said specific support rod have different inductor coefficients;
   adjusting the material of said specific support rod, such that two or more different sections of said specific support rod are made of different materials;
   adjusting the structure of said specific support rod, such that two or more different sections of said support rod have different directions; and
   adjusting the width of said specific support rod, such that two or more different sections of said specific support rod have different widths.

22. The method as set forth in claim 17, further comprising adjusting said multi-stage magnetic field by one or more of the following:
   arranging one or more conductive structures on a neighborhood of a specific said bar magnet, such that one or more sections of said specific bar magnet is located close to said conductive structure and one or more sections of said bar magnet is not located close to said conductive structure; and
   arranging one or more conductive structures on a neighborhood of a specific said bar magnet, such that different sections of said specific bar magnet are located close to different conductive structures, wherein one of said sections and a corresponding one of said conductive structures has an individual relative position.

23. The method as set forth in claim 17, further comprising adjusting a first voltage applied on said first continuous loop of winding coils and a second voltage applied on said second continuous loop of winding coils, wherein said first voltage is independent or dependent on said second voltage.

24. The method as set forth in claim 17, further comprising a step of arranging a second set of bar magnets located in a second preset distance from said first set of bar magnets, said second set of bar magnets comprising the following:
   a third bar magnet, said third bar magnet having a third continuous loop of winding coils; and
   a fourth bar magnet, said fourth bar magnet being located in a third preset distance from said third bar magnet, said fourth bar magnet having a fourth continuous loop of winding coils.

25. The method as set forth in claim 24, further comprising adjusting a third voltage applied on both said third continuous loop of winding coils and said fourth continuous loop of winding coils, such that said ion beam is compressed in a first direction and extended in a second direction essentially being vertical to said first direction.

* * * * *